United States Patent
Wang et al.

(10) Patent No.: US 9,349,614 B2
(45) Date of Patent: May 24, 2016

(54) DEVICE AND METHOD FOR LOCALIZED UNDERFILL

(71) Applicant: Invensas Corporation, San Jose, CA (US)

(72) Inventors: Liang Wang, Fremont, CA (US); Rajesh Katkar, San Jose, CA (US); Charles G. Woychik, San Jose, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/453,413

(22) Filed: Aug. 6, 2014

(65) Prior Publication Data

US 2016/0042978 A1     Feb. 11, 2016

(51) Int. Cl.
| | |
|---|---|
| *H01L 21/44* | (2006.01) |
| *H01L 21/56* | (2006.01) |
| *H01L 25/065* | (2006.01) |
| *H01L 23/31* | (2006.01) |
| *H01L 25/00* | (2006.01) |

(52) U.S. Cl.
CPC .......... *H01L 21/563* (2013.01); *H01L 23/3157* (2013.01); *H01L 25/0655* (2013.01); *H01L 25/50* (2013.01)

(58) Field of Classification Search
CPC ..... H01L 21/56; H01L 23/3128; H01L 24/97; H01L 21/563; H01L 2924/01033; H01L 2224/16; H01L 2224/73203; H01L 2224/97; H01L 2924/01029; H01L 2924/15311; H01L 2224/81
See application file for complete search history.

(56) References Cited

U.S. PATENT DOCUMENTS

| | | |
|---|---|---|
| 5,056,215 A | 10/1991 | Blanton |
| 7,041,532 B2 | 5/2006 | Grigg |
| 7,064,002 B2 | 6/2006 | Grigg |
| 2005/0019981 A1* | 1/2005 | Wang ........................... 438/108 |
| 2010/0147573 A1 | 6/2010 | Fukuda |
| 2010/0224398 A1 | 9/2010 | Matsuno |
| 2012/0146177 A1 | 6/2012 | Choi |

FOREIGN PATENT DOCUMENTS

| | | |
|---|---|---|
| JP | H02 105548 A | 4/1990 |
| JP | 2001 244299 A | 9/2001 |
| JP | 2005 167072 A | 6/2005 |

OTHER PUBLICATIONS

International Search Report and Written Opinion for PCT/US2015/042833, dated Nov. 10, 2015.

* cited by examiner

*Primary Examiner* — Roy Potter
(74) *Attorney, Agent, or Firm* — Haynes and Boone, LLP

(57) ABSTRACT

A device and method for localizing underfill includes a substrate, a plurality of dies, and underfill material. The substrate includes a plurality of contacts and a plurality of cavities separated by a plurality of mesas. The plurality of dies is mounted to the substrate using the plurality of contacts. The underfill material is located between the substrate and the dies. The underfill material is localized into a plurality of regions using the mesas. Each of the contacts is located in a respective one of the cavities. In some embodiments, the substrate further includes a plurality of channels interconnecting the cavities. In some embodiments, the substrate further includes a plurality of intra-cavity mesas for further localizing the underfill material. In some embodiments, outer edges of a first one of the dies rest on first mesas located on edges of a first one of the cavities.

18 Claims, 5 Drawing Sheets

DEVICE AND METHOD FOR LOCALIZED UNDERFILL

BACKGROUND

The present disclosure relates generally to packaging of integrated circuit devices and more particularly to localizing underfill.

Semiconductor devices, such as memory devices, processors, application-specific integrated circuits (ASICs), and other chips are typically fabricated in a multi-step process. A large number of devices are initially fabricated on a large substrate, such as a wafer. The substrate typically includes at least one layer of a semiconductor material, such as silicon, gallium arsenide, and/or the like. Using various photolithographic, depositing, etching, and/or other semiconductor processes, patterns of one or more layers of semiconductor, metals, dielectrics, and/or the like are formed on the substrate to create various devices, interconnects, and so forth. Multiple semiconductor circuits are typically fabricated on each substrate with the substrate being sliced or cut into separate dies or dice, with each of the dies having a circuit or circuits for a specific purpose.

Given the generally small size of the dies, each of the dies is typically mounted onto an interposer or other packaging substrate. The interposer may serve one or more purposes in a package such as providing ease of handling, protecting the die, increasing spacing between contacts on the die to support inclusion of the die in larger circuits, and/or the like. In some cases, multiple dies of the same or different types are mounted on the same interposer so that the interposer may provide packaging support for each of the multiple dies. As part of the mounting processes, an underfill material, such as an epoxy resin, is often used between the dies and the interposer to protect the contacts between the dies and the interposer, to help adhere the dies to the interposer, and/or the like. While underfill may simplify some issues associated with device fabrication, but it may also introduce others.

Accordingly, it would be desirable to have improved methods for using underfill during semiconductor packaging.

SUMMARY

According to one embodiment, a semiconductor package includes a substrate, a plurality of dies, and underfill material. The substrate includes a plurality of contacts and a plurality of cavities separated by a plurality of mesas. The plurality of dies is mounted to the substrate using the plurality of contacts. The underfill material is located between the substrate and the dies. The underfill material is localized into a plurality of regions using the mesas. Each of the contacts is located in a respective one of the cavities.

According to another embodiment, a semiconductor package includes a substrate, a plurality of dies, and underfill material. The substrate includes a plurality of contacts and a plurality of cavities separated by a plurality of mesas. The plurality of dies is mounted to the substrate using the plurality of contacts. The underfill material is located between the substrate and the dies. A first width of a first one of the dies in a first direction is greater than a second width of a first one of cavities in the first direction. A first outer edges of the first one of the dies rest on first mesas located on first edges of the first one of the cavities in the first direction. The underfill material is localized into a plurality of regions using the mesas. Each of the contacts is located in a respective one of the cavities.

According to another embodiment, a method of packaging semiconductor dies includes forming a first substrate having a plurality of contacts including first and second contacts. Forming a first cavity and a second cavity in the first substrate, the first and second cavities being separated by a mesa with the first contacts being located in the first cavity and the second contacts being located in the second cavity. Mounting a first die to the first substrate using the first contacts. Mounting a second die to the first substrate using the second contacts. Adding first underfill material to a first area between the first substrate and the first die. Adding second underfill material to a second area between the first substrate and the second die. Maintaining separation between the first underfill material and the second underfill material using the mesa.

In the figures, elements having the same designations have the same or similar functions.

DETAILED DESCRIPTION

In the following description, specific details are set forth describing some embodiments consistent with the present disclosure. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

Figure 1:
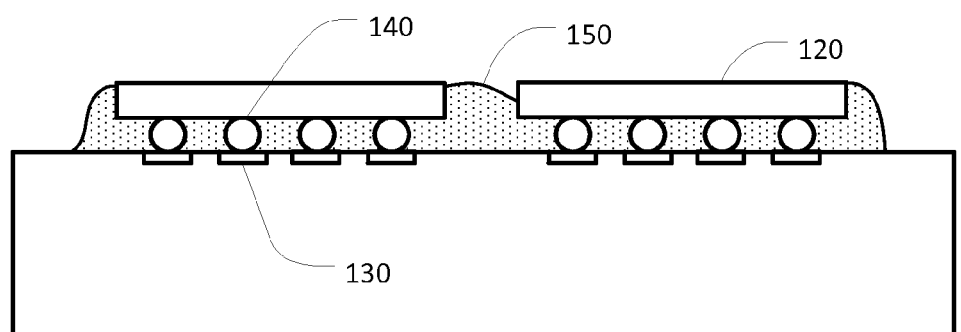
FIG. 1 is a simplified diagram of a multi-die package according to some embodiments.

FIG. 1 is a simplified diagram of a multi-die package 100 according to some embodiments. As shown in FIG. 1, package 100 includes a substrate 110. Substrate 110 is representative of any number of possible substrates on which one or more dies may be mounted. For example, substrate 110 may be a wafer, an interposer, and/or the like. Substrate 110 may include one or more semiconductor materials, metals, dielectrics, and/or the like. As further shown, substrate 110 may be used to mount a plurality of dies 120 as part of package 100.

And although FIG. 1 shows only two dies 120, package 100 may include any number of dies 120. As further shown in FIG. 1, dies 120 are shown mounted to substrate 110 using a flip-chip mounting approach. Thus, substrate 110 includes a series of landing pads 130 formed using one or more conductive materials, such as a metal. Each of the dies 120 includes a corresponding series of solder balls or microbumps 140 formed using one more conductive materials, such as a metal. Each of the microbumps 140 are designed to be electrically coupled to a respective one of the landing pads 130 using, for example, a soldering process. The combination of the landing pads 130 and microbumps 140 electrically couple the circuitry of the dies 120 to the circuitry of substrate 110.

Package 100 further includes an underfill material 150 that is used to help mount the dies 120 to substrate 110. In some embodiments, underfill 150 may be present between each of the microbumps 140, between the dies 120 and substrate 110, and/or between the dies 120. In some embodiments, portions of underfill 150 may also more fully encapsulate the dies 120 with the portions of underfill 150 also being present on the upper surfaces of the dies 120. In some embodiments, underfill 150 may not be uniform in thickness as it is often difficult to completely control the amount of underfill 150 used during the die mounting process. In some embodiments, underfill 150 may be composed of an epoxy type material and/or some other type of elastomeric material. In some embodiments, underfill 150 may include a quantity of fluxing material. Depending upon the mounting process, underfill 150 may be applied to substrate 110 before microbumps 140 are soldered to landing pads 130 and/or may be injected between microbumps 140 after microbumps 140 are soldered to landing pads 130. In some embodiments, underfill 150 may be cured after it is applied.

According to some embodiments, underfill 150 may provide certain advantages to package 100. In some examples, underfill 150 may provide protection for microbumps 140 and/or landing pads 130 from environmental contaminants such as moisture, debris, and/or the like, which may damage microbumps 140 and/or landing pads 130 and/or cause shorting between microbumps 140 and/or landing pads 130. In some examples, underfill 150 may help adhere the dies 120 to substrate 110 so as to provide additional structural stability to package 100, reduce the likelihood that one or more of the dies 120 will detach from substrate 110, and/or the like. In some examples, underfill 150 may also assist in the shedding of excess heat generated by the dies 120 and/or substrate 110 during device operation.

Despite the advantages that underfill 150 provides, underfill 150 may also introduce one or more disadvantages. In some embodiments, the excess underfill 150 located to the sides of the dies 120 may interfere with other circuits, structures, and/or devices included in package 100. For example, a structure with one or more moving parts, such as a microelectromechancial system (MEMS), may be undesirably restricted by the excess underfill 150. In some embodiments, one or more material properties of underfill 150 may adversely affect package 100. In some examples, a coefficient of thermal expansion for underfill 150 may differ from a coefficient of thermal expansion for the materials in the dies 120 and/or substrate 110. As underfill 150 is heated and/or cooled during the curing process and/or device operation, the differences in expansion and/or contraction between underfill 150 and the dies 120 and/or substrate 110 may become significant. In some examples, the differences may result in warping of substrate 110, buckling of the dies 120, and/or the like. In some examples, the warping and/or buckling may result in damage to the electrical coupling between landing pads 130 and microbumps 140, damage to substrate 110 and/or the dies 120, and/or alteration of important physical dimensions and/or shapes of package 100. In some embodiments, it may also be desirable to reduce the amount of underfill 150 used to mount the dies 120 to substrate 110.

Figure 2:
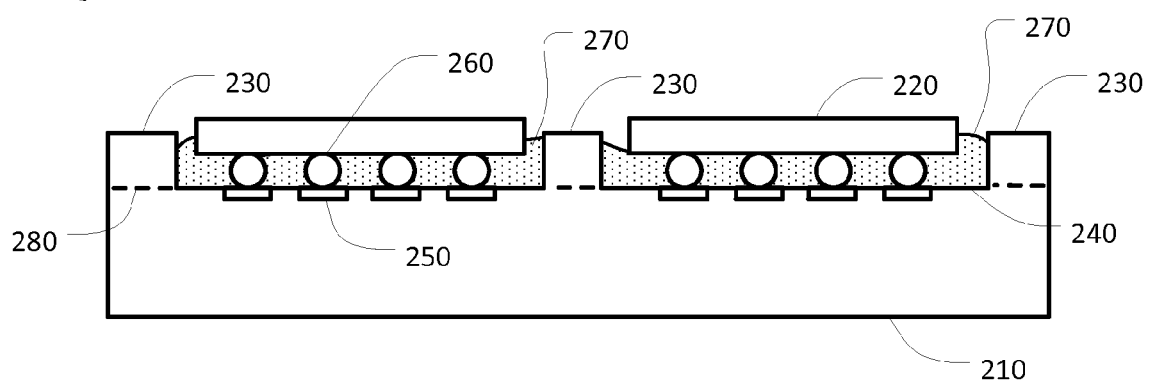
FIG. 2 is a simplified diagram of a side-view of a multi-die package using an interposer with cavities according to some embodiments.

FIG. 2 is a simplified diagram of a side-view of a multi-die package 200 using an interposer with cavities according to some embodiments. As shown, package 200 may be used to address one or more of the disadvantages of package 100 shown in FIG. 1. As shown in FIG. 2, package 200 includes an interposer 210. In some examples, interposer 210 may be a wafer and/or some other type of substrate. Interposer 210 may include one or more semiconductor materials, metals, dielectrics, and/or the like. As further shown, interposer 210 may be used to mount a plurality of dies 220 as part of package 200. And although FIG. 2 shows only two dies 220, package 200 may include any number of dies 220. In contrast to substrate 110, which has a substantially flat surface on which the dies 120 are mounted, interposer 210 includes a plurality of mesas 230. Mesas 230 may be used to delineate a plurality of regions, pockets, openings, or cavities 240. Each of the cavities 240 may be designed to have at least one of the dies 220 mounted therein. And although FIG. 2 shows only one die 220 mounted in each of the cavities 240, any number of dies 220 may be mounted in each of the cavities 240. As shown in FIG. 2, interposer 210 and mesas 230 are generally shown as a single combined unit, however, in some embodiments, the interposer 210 and mesas 230 may be formed as two separate elements where the element including the mesas 230 is formed separately from interposer 210 and is then mounted or bonded to interposer 210. In some examples, the element including the mesas 230 may be mounted and/or bonded to interposer 210 using a wafer to wafer bonding technique. In some examples, the point of bonding may correspond to mesa-interposer bonding interface 280.

In the examples, of FIG. 2, each of the cavities 240 includes one of the dies 220 mounted to interposer 210 using a flip-chip mounting approach, although other approaches for mounting and/or electrically connecting dies to an interposer may be used in each of the cavities 240. As shown in FIG. 2, each of the cavities 240 includes a series of landing pads 250 formed using one or more conductive materials, such as a metal. Each of the dies 220 includes a corresponding series of solder balls or microbumps 260 formed using one more conductive materials, such as a metal. Each of the microbumps 260 are designed to be electrically coupled to a respective one of the landing pads 250 using, for example, a soldering process. The combination of the landing pads 250 and microbumps 260 electrically couple the circuitry of the dies 220 to the circuitry of interposer 210.

Package 200 further includes an underfill material 270 that is used to help mount the dies 220 within the cavities 240 of interposer 210. Similar to underfill 150 of package 100, underfill 270 may be present between each of the microbumps 260 and between the dies 220 and interposer 210. However, unlike the underfill 150 of package 100, underfill 270 of package 200 is divided into localized regions, generally defined by the cavities 240, so that no continuous portion of underfill 270 is present between dies 220 because the mesas 230 generally restrict underfill 270 from forming a single continuous mass of material. In some embodiments, underfill 270 from each of the cavities 240 may be kept separate from underfill 270 in any other of the cavities 240. In some embodiments, a thickness of underfill 270 in the cavities 240 may be less than a thickness of underfill 270 over the mesas 230. In some examples, no underfill 270 may be used over the mesas 230. In some embodiments, underfill 270 may or may not be of uniform thickness in each of the cavities 240. In some embodiments, underfill 270 may be composed of an epoxy type material and/or some other type of elastomeric material. In some embodiments, underfill 270 may include a quantity of fluxing material. Depending upon the mounting process, underfill 270 may be applied within the cavities 240 of interposer 210 before microbumps 260 are soldered to landing pads 250 and/or may be injected between microbumps 260 after microbumps 260 are soldered to landing pads 250. In some embodiments, underfill 270 may be cured after it is applied.

According to some embodiments, the separation of underfill 270 in the cavities 240 may provide advantages to package 200 over package 100. In some examples, the effects of coefficient of thermal expansion differences between underfill 270 and the dies 220 and/or interposer 210 may be mitigated. In some examples, the localization of each portion of underfill 270 to one of the cavities 240 may limit the differences in the expansions and contractions of that portion of underfill 270 to the corresponding cavity 240. In some examples, this may reduce the likelihood that interposer 210 may be subject to warping. In some example, this may reduce the likelihood that the corresponding die 220 may be subject to buckling. In some embodiments, use of the mesas 230 and the cavities 240 may control the placement of underfill 270 and may reduce the likelihood that underfill 270 may extend into undesirable regions of interposer 210. In some examples, use of the mesas 230 and the cavities 240 may reduce the amount of underfill 270 used with package 200.

Figure 3:
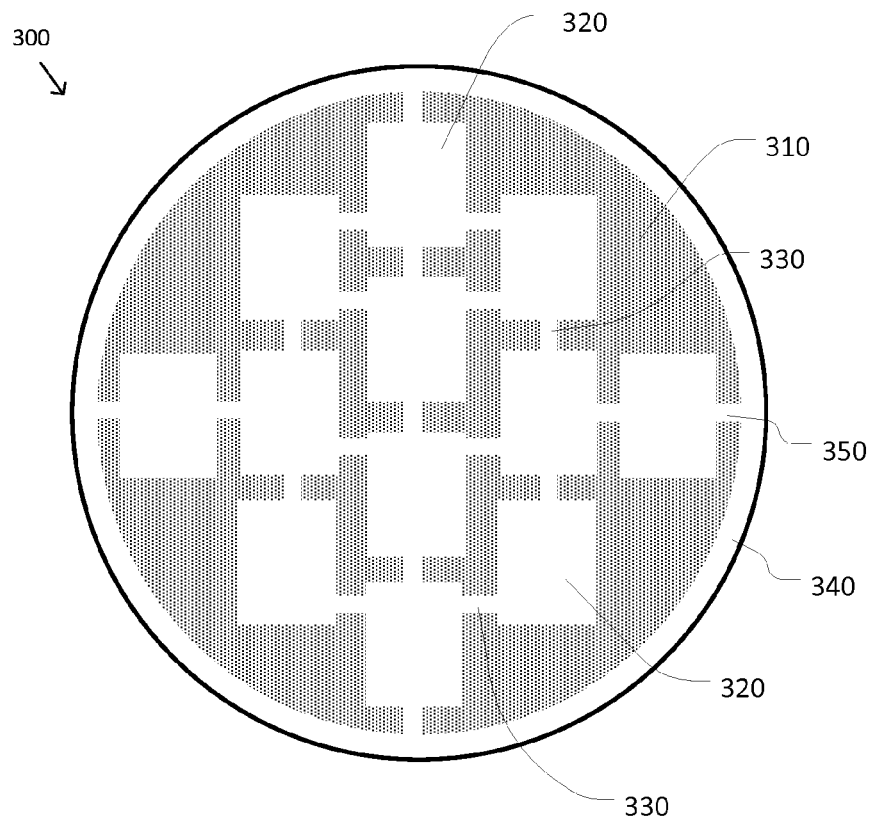
FIG. 3 is a simplified diagram of a top view of a multi-die interposer having cavities according to some embodiments.

FIG. 3 is a simplified diagram of a top view of a multi-die interposer 300 having cavities according to some embodiments. In some embodiments, interposer 300 may be consistent with interposer 210. In some embodiments, interposer 300 may be a wafer and/or some other type of substrate, and although interposer 300 is shown in FIG. 3 as being circular in shape, interposer 300 may be of any other suitable shape including rectangular, polygonal, and/or the like. As further shown in FIG. 3, interposer 300 includes a plurality of raised regions or mesas 310. In some examples, the raised regions 310 may correspond to the mesas 230 of interposer 210 in FIG. 2. The mesas 310 delineate a plurality of cavities 320 that may correspond to the cavities 240 of FIG. 2. As with the cavities 240, each of the cavities 320 may include a plurality of landing pads (not shown) to which corresponding dies, such as dies 220, may be mounted.

In some embodiments, the cavities 320 may be interconnected by a series of channels 330 through the mesas 310. In some examples, each of the channels 330 may provide a region through the mesa 310 between two of the cavities 320 through which underfill may flow. In some examples, the channels 330 may be used to channel excess underfill away from the cavities 320. In some examples, the channels 330 may also support the introduction of underfill between the dies and interposer 300 after the dies are mounted to interposer 300. In some examples, the channels 330 may be shallower than the cavities 320 to help confine underfill to the cavities 320 and/or to reduce the effects of thermal expansion and/or contraction of any underfill remaining in the channels 330 after device fabrication. In some embodiments, interposer 300 may additionally include an outer ring channel 340 to further support the channeling of excess underfill away from the cavities 320. In some examples, outer ring channel 340 may be shallower than the cavities 320. In some examples, outer ring channel 340 may be connected to the cavities 320 and/or the channels 330 by additional channels 350 through the mesas 310. In some examples, the outer ring channel 340 may be deeper than the channels 330 and/or the channels 350. In some embodiments, the channels 330, outer ring channel 340 and/or the channels 350 may be designed to promote the removal of excess underfill from the cavities 320. In some examples, the pattern and/or layout of the channels 330, outer ring channel 340 and the channels 350 may support the removal of the excess underfill via a centrifugal force induced by spinning interposer 300.

Figure 4:
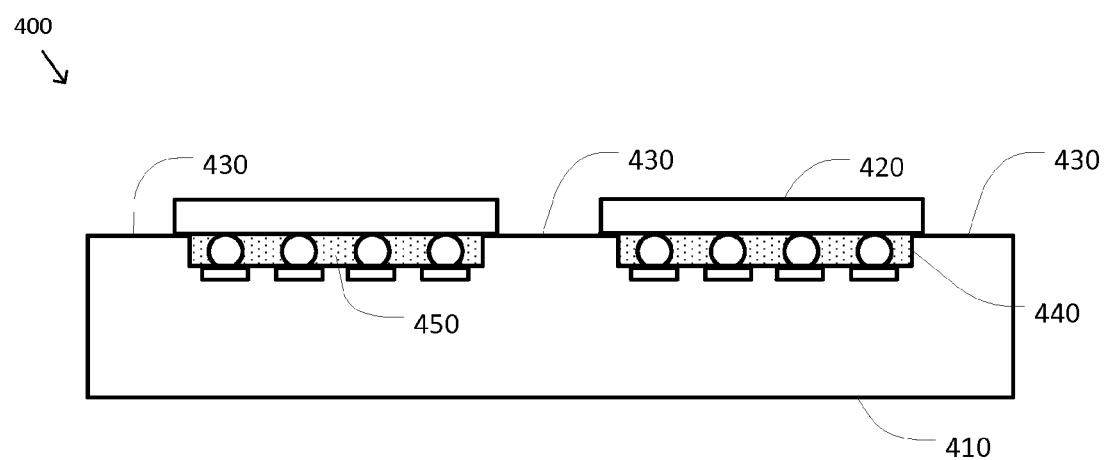
FIG. 4 is a simplified diagram of a side-view of a multi-die package using an interposer with cavities according to some embodiments.

FIG. 4 is a simplified diagram of a side-view of a multi-die package 400 using an interposer with cavities according to some embodiments. As shown in FIG. 4, package 400 includes an interposer 410 to which a plurality of dies 420 is mounted. And although FIG. 4 shows only two dies 420, package 400 may include any number of dies 420. In some embodiments, interposer 410 may be consistent with interposer 300 and may include one or more channels similar to the channels 330, outer ring channel 340, and/or channels 350. Similar to interposer 210 of FIG. 2, interposer 410 includes a plurality of mesas 430 that delineate a plurality of regions or cavities 440. However, in contrast to package 200, the cavities 440 of interposer 410 are smaller in size relative to the dies 420 than the cavities 240 are relative to the dies 220. In some embodiments, the dies 420 may be considered to be mounted over the cavities 440 rather than mounted in the cavities 440 as is the typical arrangement of package 200 where the dies 220 are mounted in the cavities 240.

In some embodiments, the lateral width of each of the cavities 440 may be shorter than a corresponding width of the die 420 mounted to landing pads disposed in the corresponding cavity 440 so that one or more of the outer edges of the corresponding die 420 may be resting on the mesas 430 located around the corresponding cavity 440. In some examples, a lower surface of the die in the area of the outer edges of the corresponding die 420 is in contact with an upper surface of the mesas 430 located around the corresponding cavity 440. In some examples, resting the corresponding die 420 on the mesas 430 may provide stability to the corresponding die 420 in package 400. In some examples, resting the corresponding die 420 on the mesas 430 may provide a positioning and/or leveling benefit as a vertical position of the corresponding die 420 relative to interposer 410 and the bottom of the corresponding cavity 440 may be managed and/or controlled by the height of the mesas 430 around the corresponding cavity 440. In some examples, by resting the outer edges of each of the dies 420 on the mesas 430, heights of the dies 420 relative to the interposer 410 in package 400 may be better managed even though there may be variations in the depth of the cavities 440 and/or the collective heights of the microbumps and landing pads (or other mounting elements and/or contacts) used to mount the dies 420 to interposer 410. In some examples, resting the outer edges of each of the dies 420 on the mesas 430 may also help reduce any buckling due to the coefficient of thermal expansion differences between underfill 450 and the dies 420 and/or interposer 410.

In some embodiments, the cavities 440 may be shallower than the cavities 240 (or alternatively the mesas 430 may be higher than the mesas 230). In some examples, the depth of the cavities 440/height of the mesas 430 may be determined based on an amount of space for the landing pads and microbumps (or other mounting elements and/or contacts) used to mount the dies 420 to interposer 410. In some examples, the shallower cavities 440 may help reduce an amount of underfill 450 used in package 400 between the microbumps and/or contacts of the dies 420. In some examples, the use of lesser amounts of underfill 450 may also help reduce any buckling due to the coefficient of thermal expansion differences between underfill 450 and the dies 420 and/or interposer 410.

Figure 5:
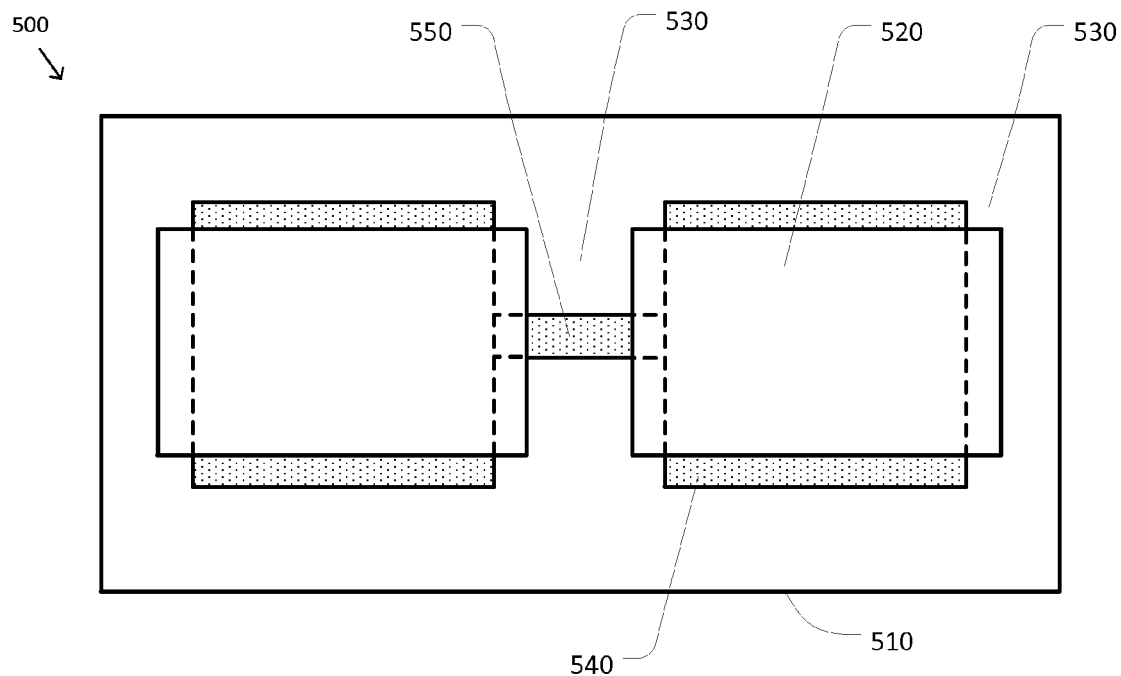
FIG. 5 is a simplified diagram of a top view a multi-die package using an interposer with cavities according to some embodiments.

FIG. 5 is a simplified diagram of a top view a multi-die package 500 using an interposer with cavities according to some embodiments. In some embodiments, package 500 may be consistent with package 400. As shown in FIG. 5, package 500 includes an interposer 510 to which a plurality of dies 520 is mounted. In some embodiments, interposer 510 may be consistent with interposer 410 and/or interposer 300. As shown in FIG. 5, interposer 510 includes a plurality of mesas 530 that delineate a plurality of cavities 540 in interposer 510. In some embodiments, the relative dimensions of the dies 520 and the cavities 540 may vary. In some examples, the dies 520 may be shorter in a first direction (e.g., vertically as shown in FIG. 5) than the cavities 540. In some examples, the dies 520 may be longer in a second direction (e.g., horizontally as shown in FIG. 5) than the cavities 540. Thus, as shown in FIG. 5, the dies 520 may extend in the first dimension over the mesas 530 so that outer edges of the dies 520 in the second direction may rest on the mesas 530 in a similar way that the outer edges of the dies 520 may rest on the mesas 530. In some examples, the portions of the cavities 540 that extend beyond outer edges of the dies 520 in the first direction may provide one or more openings into which underfill may be injected after the dies 520 are mounted to interposer 510. In some embodiments, interposer 510 may further include one or more channels 550 between the cavities 540. In some examples, the channels 550 may be similar to the channels 330 and/or the channels 350.

As discussed above and further emphasized here, FIG. 5 is merely an example which should not unduly limit the scope of the claims. One of ordinary skill in the art would recognize many variations, alternatives, and modifications. In some embodiments, one or more of the dies 520 may extend over the mesas 530 on fewer or more than two sides of a respective cavity 540. In some examples, the die 520 may extend over just a single one of the mesas 530 along one edge of the die 520 and/or at one corner of the die 520. In some examples, the die 520 may extend over both of the mesas 530 in the first direction and one of the mesas 530 in the second direction so that the die 520 extends over the mesas 530 on three of its four sides. In some examples, the dies 520 need not be smaller than the respective cavity in 540 in the second direction and still extend over one of the mesas 530 in the second direction and provide an underfill opening as well. In some examples, the die 520 may also rest on the mesas 530 on the three of the four sides. In some examples, an opening may remain on the fourth of the four sides to, for example, provide an opening for injecting underfill. In some embodiments, one or more of the cavities 540 may have other than a rectangular shape. In some examples, the other shape may include circular, other polygonal shapes, and/or the like. In some embodiments, one or more of the dies 520 may be oriented in a different direction than the corresponding cavity 540. In some examples, the major axes of the die 520 may be oriented at a 45 degree or other acute angle relative to the major axes of the corresponding cavity 540 so that the die 520 is oriented diagonally relative to the corresponding cavity 540.

Figure 6:
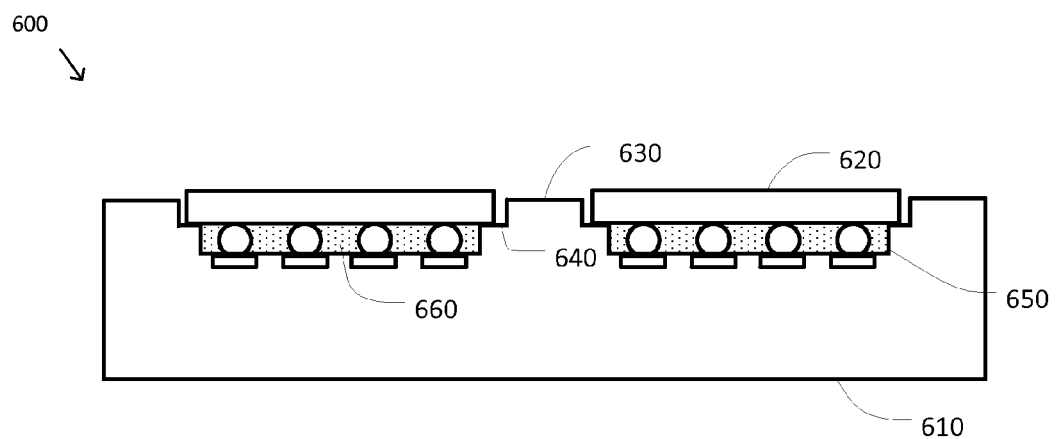
FIG. 6 is a simplified diagram of a side-view of a multi-die package using an interposer with tiered cavities according to some embodiments.

FIG. 6 is a simplified diagram of a side-view of a multi-die package 600 using an interposer with tiered cavities according to some embodiments. As shown in FIG. 6, package 600 includes an interposer 610 to which a plurality of dies 620 is mounted. And although FIG. 6 shows only two dies 620, package 600 may include any number of dies 620. In some embodiments, interposer 610 may be consistent with interposer 300 and may include one or more channels similar to the channels 330, outer ring channel 340, and/or channels 350. Similar to interposer 210 of FIG. 2, interposer 610 includes a plurality of tiered mesas that delineate a plurality of regions or cavities 650. The tiered mesas in package 600 include an upper tier 630 and a lower tier 640.

In some embodiments, the lateral width of each of the cavities 650 between the lower tiers 640 may be shorter than a corresponding width of the die 620 mounted to landing pads disposed in the corresponding cavity 650 so that one or more of the outer edges of the corresponding die 620 may be resting on the lower tiers 640 located around the corresponding cavity 650. In some examples, a lower surface of the die in the area of the outer edges of the corresponding die 620 is in contact with an upper surface of the lower tiers 640 located around the corresponding cavity 620. In some examples, resting the corresponding die 620 on the lower tiers 640 may provide stability to the corresponding die 620 in package 600. In some examples, resting the corresponding die 620 on the lower tiers 640 may provide a positioning and/or leveling benefit as a vertical position of the corresponding die 620 relative to interposer 610 and the bottom of the corresponding cavity 650 may be managed and/or controlled by the height of the lower tiers 640 around the corresponding cavity 650. In some examples, by resting the outer edges of each of the dies 620 on the lower tiers 640, heights of the dies 620 relative to the interposer 610 in package 600 may be better managed even though there may be variations in the depth of the cavities 650 and/or the collective heights of the microbumps and landing pads (or other mounting elements and/or contacts) used to mount the dies 620 to interposer 610. In some examples, resting the outer edges of each of the dies 620 on the lower tiers 640 may also help reduce any buckling due to the coefficient of thermal expansion differences between underfill 660 and the dies 620 and/or interposer 610.

In some embodiments, the lateral width of each of the cavities 650 between the upper tiers 630 may longer than a corresponding width of the die 620 with the respective cavity 650. In some examples, a height of the upper tiers 630 relative to a height of the lower tiers 640 may provide for additional containment of underfill 660 and/or reduce the amount of underfill 660 used with package 600. In some examples, the height of the upper tiers 630 may be adjusted so that the top of the dies 620 may be above, even with, or below an upper surface of the upper tiers 630.

Figure 7:
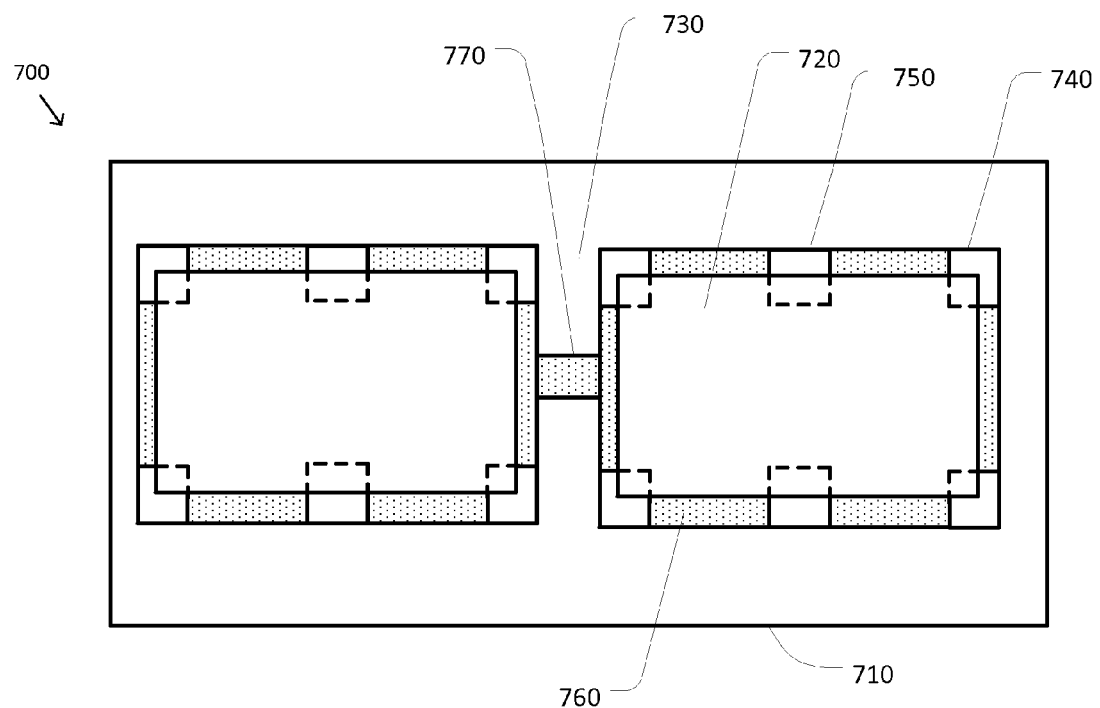
FIG. 7 is a simplified diagram of a top view a multi-die package using an interposer with tiered cavities according to some embodiments.

FIG. 7 is a simplified diagram of a top view a multi-die package 700 using an interposer with tiered cavities according to some embodiments. In some embodiments, package 700 may be consistent with package 600. As shown in FIG. 7, package 700 includes an interposer 710 to which a plurality of dies 720 is mounted. In some embodiments, interposer 710 may be consistent with interposer 610 and/or interposer 300. As shown in FIG. 7, interposer 710 includes a plurality of mesas that delineate a plurality of cavities 760 in interposer 710. Each of the mesas may include upper tiers 730 and one or more lower tiers. In some embodiments the lower tiers may include one or more corner regions 740 and one or more side regions 750. In some embodiments, the relative dimensions of the dies 720 and the cavities 760 may vary. In some examples, the dies 720 may be smaller than distances between the upper tiers 730 of the corresponding cavity 760. In some examples, the dies 720 may be larger than distances between the corner regions 740 and/or the side regions 750 so that the dies 720 may extend over the corresponding corner regions 740 and/or side regions 750. In some examples, the corners of the dies 720 may rest on the corner regions 740. In some examples, the edges of the dies 720 may rest on the side regions 750. In some examples, the portions of the cavities 760 that extend beyond outer edges of the dies 720 may provide one or more openings into which underfill may be injected after the dies 720 are mounted to interposer 710.

Although not shown in FIG. 7, in some embodiments, the shapes of the corner regions 740 and/or the side regions 750 may have other than rectangular shapes. In some examples, one or more of the corner regions 740 may be triangular in shape, polygonal in shape, or wedge shaped having a circular arc-shaped inner edge (e.g., a quarter circle shape) extending into the corresponding cavity 760. In some examples, one or more of the side regions 750 may be triangular in shape, polygonal in shape, or wedge shaped having a circular arc-shaped inner edge (e.g., a half circle shape) extending into the corresponding cavity 760. In some embodiments, interposer 710 may further include one or more channels 770 between the cavities 760. In some examples, the channels 770 may be similar to the channels 330 and/or the channels 350.

Figure 8:
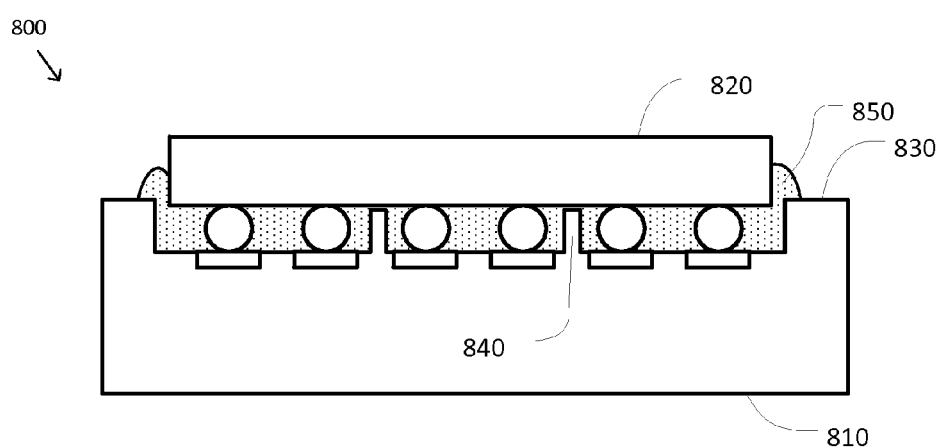
FIG. 8 is a simplified diagram of a side view of a multi-die package using an interposer with cavities according to some embodiments.

FIG. 8 is a simplified diagram of a side view of a multi-die package 800 using an interposer with cavities according to some embodiments. As shown in FIG. 8, package 800 includes an interposer 810 to which a plurality of dies 820 is mounted. And although FIG. 8 shows only one die 820, package 800 may include any number of dies 820. In some embodiments, interposer 810 may be consistent with interposer 300 and may include one or more channels similar to the channels 330, outer ring channel 340, and/or channels 350. Similar to interposer 210 of FIG. 2 and interposer 410 of FIG. 4, interposer 810 includes a plurality of mesas 830 that delineate a plurality of regions or cavities. However, in contrast to packages 200 and/or 400, the cavities of interposer 810 are divided into a plurality of sub-cavities by one or more intra-cavity mesas 840. In some embodiments, each of the intra-cavity mesas 840 may be used to localize underfill 850 in the cavities of interposer 810 so that underfill 850 is subdivided into smaller overall volumes of underfill 850 that are localized to each of the sub-cavities. In some examples, the further localization of underfill 850 to the sub-cavities may further reduce the effects due to the coefficient of thermal expansion differences between underfill 850 and the dies 820 and/or interposer 810. In some examples, the further localization of underfill 850 to the sub-cavities may further reduce a total amount of underfill 850 utilized between interposer 810 and the dies 820. In some embodiments, heights of the intra-cavity mesas 840 may be adjusted to fully localize underfill 850 in each of the sub-cavities from underfill 850 in others of the sub-cavities and/or allow underfill 850 to extend over tops of the intra-cavity mesas 840 and below the dies 820. In some embodiments, the heights of the intra-cavity mesas 840 may be adjusted so that the dies 820 may rest on the intra-cavity mesas 840 in a fashion similar to the way the outer edges of the dies 420 rest on the mesas 430. And, although not shown in FIG. 8, in some embodiments, one or more outer edges of the dies 820 may rest on the mesas 830.

Figure 9:
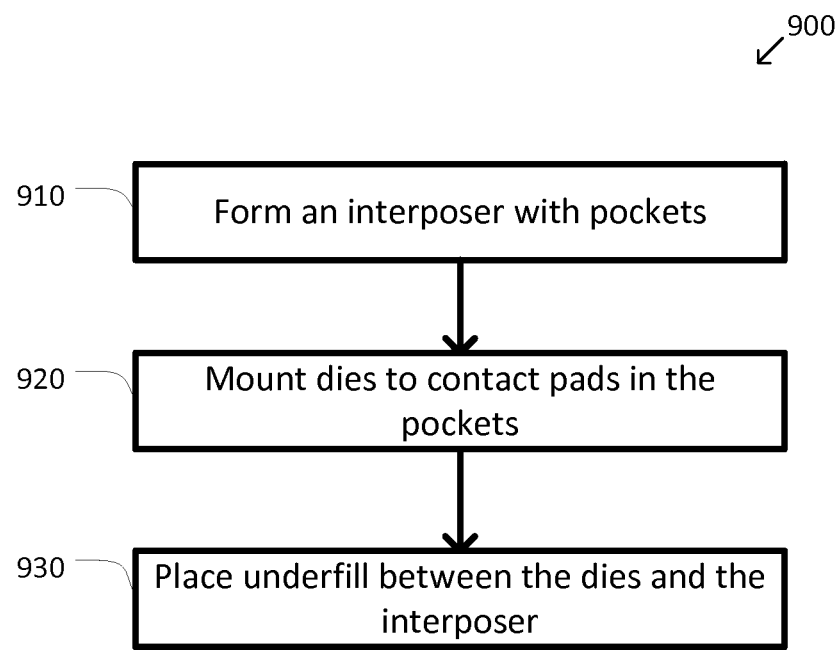
FIG. 9 is a simplified diagram of a method of packaging according to some embodiments.

FIG. 9 is a simplified diagram of a method 900 of packaging according to some embodiments. Processes 910-930 of method 900 are representative only, and one of ordinary skill in the art would understand that variations in processes 910-930 are possible including performing processes 910-930 in different orders, concurrently, and/or the like.

At a process 910, an interposer with cavities is formed. In some embodiments, beginning with a substrate, one or more etching, deposition, and/or other processes may be used to form an interposer with a plurality of cavities. In some examples, one or more etching and/or material removal processes may be used to selectively remove material from the plurality of cavities. In some examples, one or more deposition and/or material adding processes may be used to selectively build up a plurality of mesas on the substrate. In some embodiments, a first substrate with contact pads is formed separately from a second substrate having a plurality of mesas with openings between the mesas and through the second substrate that correspond to locations of the cavities. In some examples, each of the first and second substrates may be formed using one or more deposition, material adding, etching, and/or material removing processes. In some examples, once the first and second substrates are formed, they may be aligned and then bonded together using one or more wafer to wafer bonding techniques to form the interposer with cavities. In some embodiments, the resulting interposer with cavities may be similar to interposers 210, 300, 410, 510, and/or 810. In some examples, the resulting cavities may be similar to cavities 240, 320, 440, 540, and/or the sub-cavities of package 800. In some examples, the resulting mesas may be similar to mesas 230, 310, 430, 530, and/or 830 and/or intra-cavity mesas 840. In some embodiments, etching, deposition, and/or other processes may also be used to form channels such as channels 330, 350, and/or 550, and/or outer ring channel 340 in the interposer.

At a process 920, dies are mounted to contact pads in the cavities. Using one or more soldering processes and/or the like, a plurality of dies may be mounted to contact pads located in each of the cavities. In some embodiments, the contact pads may be landing pads, such as landing pads 250, and/or any other type of contact that may be used to electrically couple dies to the interposer. In some embodiments, each of the contact pads may be soldered and/or electrically coupled to corresponding microbumps, such as microbumps 260, solder balls, leads, and/or like of the dies being mounted. In some embodiments, the dies may be mounted so that they each rest on one or more of the mesas and/or intra-cavity mesas.

At a process 930, underfill is placed between the dies and the interposer. In some embodiments, underfill may be introduced between the dies and the interposer. In some embodiments, the underfill may be any of the underfills 270, 450, and/or 850. In some embodiments, the underfill may occupy any volume within the cavities and/or sub-cavities not occupied by the contacts, intra-cavity mesas, and/or dies. In some embodiments, underfill may be injected into the cavities and under the dies using any of the channels formed during process 910 and/or using any openings between outer edges of the dies and the mesas delineating the cavities and/or sub-cavities, such as the openings between the dies 520 and the mesas 530 in the first direction as shown in FIG. 5. In some embodiments, process 930 may further include removing any excess underfill using the channels formed during process 910. In some examples, the removing may include using centrifugal force.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. A semiconductor package, the package comprising:
   a substrate comprising a plurality of contacts and a plurality of cavities separated by a plurality of mesas, each of the contacts being located in a respective one of the cavities;
   a plurality of dies mounted to the substrate using the plurality of contacts;

a plurality of channels interconnecting the cavities; and
an underfill material between the substrate and the dies;
wherein the underfill material is localized into a plurality of regions using the mesas.

2. The package of claim 1 wherein the underfill material from any of the regions is separate from the underfill material from any other of the regions.

3. The package of claim 1 wherein a depth of each of the channels is less than a depth of each of the cavities.

4. The package of claim 1 wherein a first one of the mesas is a tiered mesa having an upper tier and a lower tier with a first height lower than a second height of the upper tier.

5. The package of claim 4 wherein an outer edge of one of the dies rests on the lower tier of a respective cavity.

6. The package of claim 4 wherein the lower tier includes one or more separate corner regions.

7. The package of claim 4 wherein the lower tier includes one or more separate side regions.

8. The package of claim 1, further comprising a plurality of intra-cavity mesas, each of the intra-cavity mesas subdividing a respective one of the cavities, each of the intra-cavity mesas further localizing the underfill material.

9. The package of claim 8 wherein a first one of the dies rests on a first one of the intra-cavity mesas.

10. The package of claim 1 wherein an outer edge of one of the dies rests on an upper surface of one of the mesas.

11. The package of claim 1 wherein:
a first width of a first one of the dies in a first direction is greater than a second width of a first one of the cavities in the first direction; and
first outer edges of the first one of the dies rest on first mesas located on first edges of the first one of the cavities in the first direction.

12. The package of claim 11 wherein the first one of the dies is positioned relative to the first one of the cavities so as to form a gap between a second outer edge of the first one of the dies and a second mesa located on a second edge of the first one of the cavities in a second direction to allow introduction of the underfill material, the second direction being different from the first direction.

13. A method of packaging semiconductor dies, the method comprising:
forming a first substrate having a plurality of contacts comprising first and second contacts;
forming a first cavity and a second cavity in the first substrate, the first and second cavities being separated by a mesa with the first contacts being located in the first cavity and the second contacts being located in the second cavity;
forming a channel interconnecting the first and second cavities;
mounting a first die to the first substrate using the first contacts;
mounting a second die to the first substrate using the second contacts;
adding first underfill material to a first area between the first substrate and the first die;
adding second underfill material to a second area between the first substrate and the second die; and
maintaining separation between the first underfill material and the second underfill material using the mesa.

14. The method of claim 13 wherein forming the channel comprises forming the channel to a depth that is less than a depth of each of the first and second cavities.

15. The method of claim 13, further comprising removing excess portions of the first and second underfill materials using the channel.

16. The method of claim 13, further comprising resting an outer edge of the first die on a top of the mesa.

17. The method of claim 13, further comprising:
forming one or more intra-cavity mesas in the first cavity; and
further localizing the first underfill material using the intra-cavity mesas.

18. The method of claim 13, further comprising:
forming a second substrate comprising the mesa separately from the first substrate; and
bonding the second substrate to the first substrate.

* * * * *